United States Patent
Kameda (10) Patent No.: US 7,266,016 B2
(45) Date of Patent: Sep. 4, 2007

(54) ELECTRICALLY REWRITABLE NONVOLATILE SEMICONDUCTOR MEMORY DEVICE

(75) Inventor: Yasushi Kameda, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 11/246,215

(22) Filed: Oct. 11, 2005

(65) Prior Publication Data
US 2006/0104117 A1    May 18, 2006

(30) Foreign Application Priority Data
Nov. 16, 2004 (JP) .............................. 2004-331968

(51) Int. Cl.
G11C 11/34 (2006.01)
G11C 16/04 (2006.01)
(52) U.S. Cl. .............................. 365/185.18; 365/185.25
(58) Field of Classification Search ........... 365/185.18, 365/185.25, 185.28, 189.06
See application file for complete search history.

(56) References Cited

U.S. PATENT DOCUMENTS

| | | | |
|---|---|---|---|
| 5,453,955 A | 9/1995 | Sakui et al. | |
| 6,751,126 B2 * | 6/2004 | Kim | 365/185.18 |
| 2005/0286302 A1 * | 12/2005 | O | 365/185.18 |
| 2006/0083078 A1 * | 4/2006 | Sforzin et al. | 365/189.06 |
| 2006/0140013 A1 * | 6/2006 | Maejima et al. | 365/185.29 |

FOREIGN PATENT DOCUMENTS

JP    4-276393    10/1992

* cited by examiner

*Primary Examiner*—Anh Phung
(74) *Attorney, Agent, or Firm*—Oblon, Spivak, McClelland, Maier & Neustadt, P.C.

(57) ABSTRACT

A clamp circuit is connected to one-side ends of first and second bit lines which are adjacent in a memory cell array and a data cache is connected to the other ends thereof. The first and second bit lines are selectively divided into plural portions by use of first and second switching elements. The data cache, clamp circuit and first and second switching elements are controlled by use of a control circuit and the bit line to which a memory cell of an address to be written is connected is precharged by use of the clamp circuit or data cache and the other bit line is shielded by the clamp circuit.

20 Claims, 6 Drawing Sheets

ELECTRICALLY REWRITABLE NONVOLATILE SEMICONDUCTOR MEMORY DEVICE

CROSS-REFERENCE TO RELATED APPLICATIONS

This application is based upon and claims the benefit of priority from prior Japanese Patent Application No. 2004-331968, filed Nov. 16, 2004, the entire contents of which are incorporated herein by reference.

BACKGROUND OF THE INVENTION

1. Field of the Invention

This invention relates to an electrically rewritable nonvolatile semiconductor memory device and more particularly to the technique for enhancing the read/verify operation speed in a multivalue NAND flash memory, for example.

2. Description of the Related Art

The number of memory cells connected to a bit line is increased with an increase in the memory capacity of a semiconductor memory device and the pitch of the bit lines is narrowed with a reduction in the chip size. Therefore, the capacitance associated with the bit line and the capacitance between the bit lines are steadily increased.

In a NAND flash memory, in order to reduce the influence of the capacitive coupling due to the parasitic capacitance between the bit lines, one of the adjacent two bit lines is shielded at the time of charging/discharging the bit line. For example, a bit line of an odd-numbered address is shielded when a bit line of an even-numbered address is accessed and a bit line of an even-numbered address is shielded when a bit line of an odd-numbered address is accessed (for example, refer to Jpn. Pat. Appln. KOKAI Publication No. H04-276393).

However, since the load capacitance of the bit line becomes larger as described above and the bit line is charged by use of a clamp circuit having small current driving ability in order to suppress an increase in the chip occupied area, time for charging the bit line becomes long, thereby causing the read/verify operation speed to be lowered. Further, since the bit line of large load capacitance is discharged via a cell transistor whose current driving ability is made small because of miniaturization when the bit line is discharged, long time is required for discharging and the read/verify operation speed is lowered in this respect.

BRIEF SUMMARY OF THE INVENTION

According to an aspect of the present invention, there is provided a nonvolatile semiconductor memory device comprising a memory cell array having memory cells arranged in a matrix form, a clamp circuit connected between one-side ends of first and second bit lines which are adjacent in the memory cell array and first and second wirings to which first and second bias voltages are applied and configured to set potentials of the first and second bit lines, a data cache connected to the other ends of the first and second bit lines in the memory cell array, first and second switching elements which selectively divide the first and second bit lines into plural portions, and a control circuit configured to control the data cache, clamp circuit and first and second switching elements, wherein the control circuit charges part of one of the first and second bit lines to which a memory cell of an address to be written is connected and which is divided by a corresponding one of the first and second switching elements by use of one of the clamp circuit and data cache and discharges and shields the other bit line by use of the clamp circuit.

DETAILED DESCRIPTION OF THE INVENTION

Figure 1:
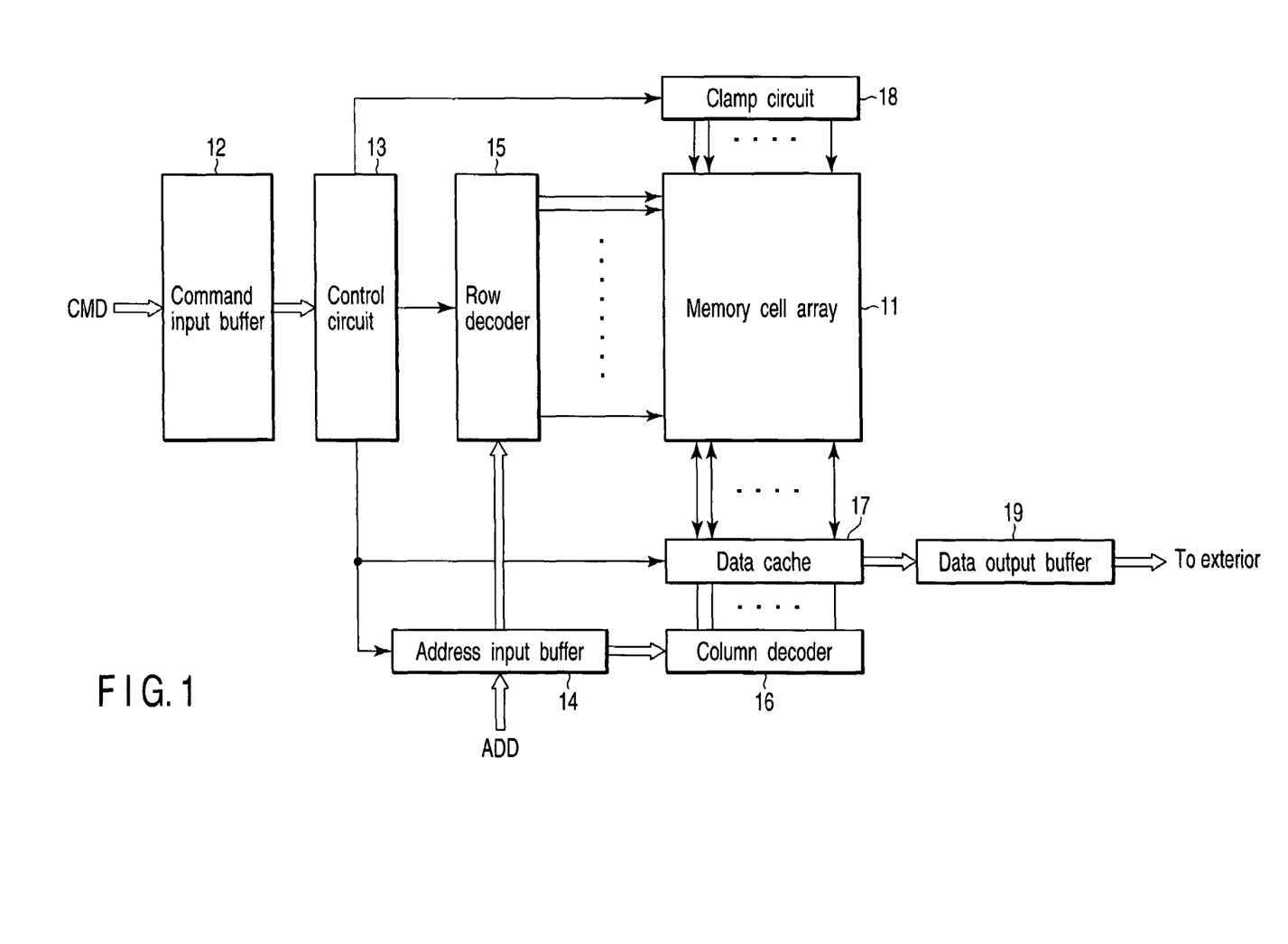
FIG. 1 is a block diagram showing the schematic configuration of a main portion relating to the read and verify operations of, for example, a multivalue NAND flash memory, for illustrating a nonvolatile semiconductor memory device according to one embodiment of this invention and a read/verify method thereof.

FIG. 1 is a block diagram showing the schematic configuration of a main portion relating to the read/verify operation of, for example, a multivalue NAND flash memory, for illustrating a nonvolatile semiconductor memory device according to one embodiment of this invention.

As shown in FIG. 1, the NAND flash memory includes a memory cell array 11, command input buffer 12, control circuit 13, address input buffer 14, row decoder 15, column decoder 16, data cache 17, clamp circuit 18 and data output buffer 19. When a command CMD is input to the command input buffer 12, the command is decoded by the control circuit 13 and the address input buffer 14, row decoder 15, data cache 17, clamp circuit 18 and the like are controlled according to the command CMD by the control circuit 13.

A row address signal among the address signal ADD input to the address input buffer 14 is supplied to and decoded by the row decoder 15 and a column address signal is supplied to and decoded by the column decoder 16. One of the memory cells (cell transistors) in the memory cell array 11 is selected and accessed by the row decoder 15 and column decoder 16. At this time, the charging (precharge) operation and discharging (shielding) operation of the bit line are performed by the clamp circuit 18. Data read out from the selected memory cell is amplified by the sense amplifier portion of the data cache 17, latched by the latch portion and supplied to the exterior via the data output buffer 19.

Figure 2:
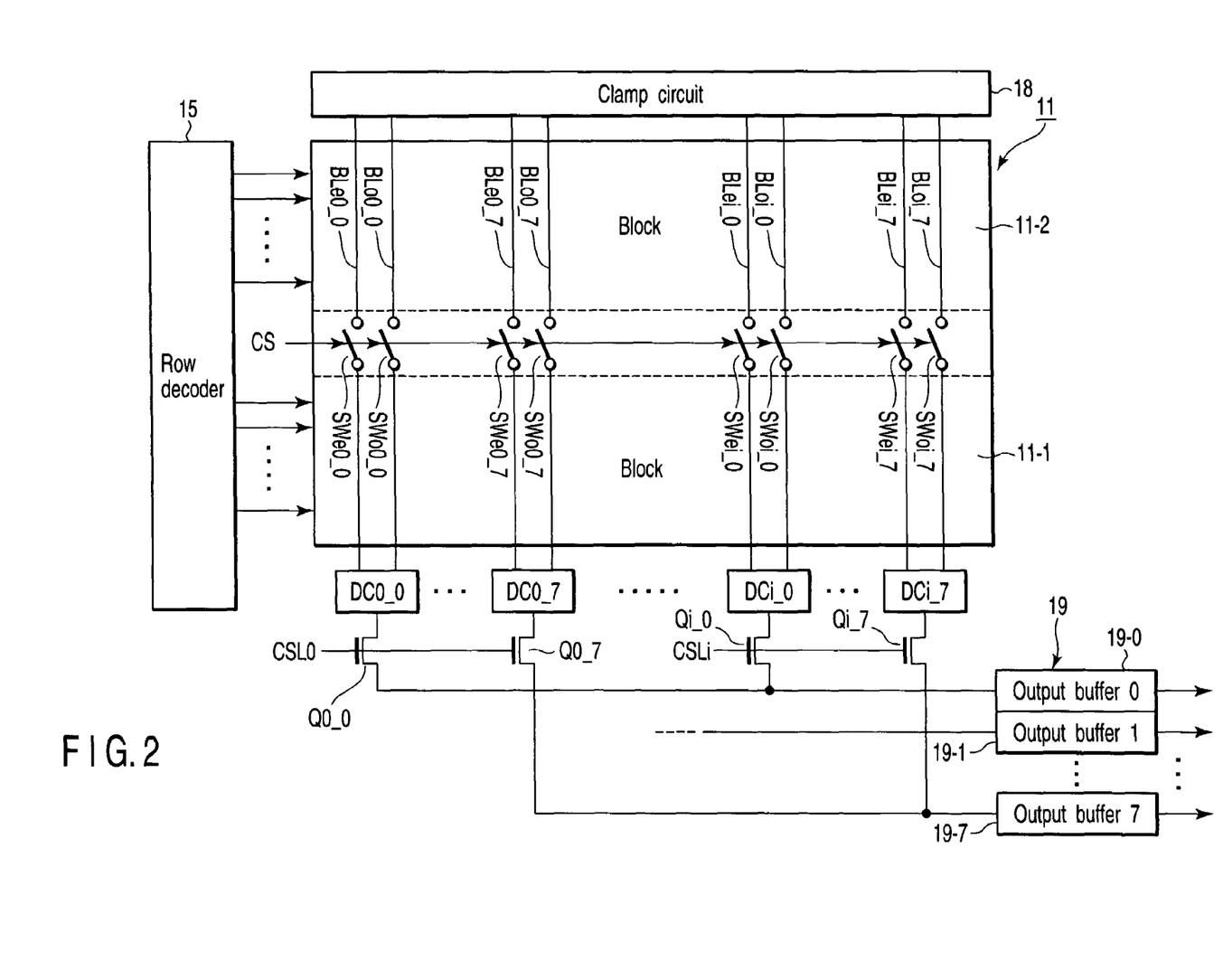
FIG. 2 is a block diagram showing a memory core portion and the peripheral circuit thereof in the circuit shown in FIG. 1.

FIG. 2 is a block diagram showing a memory core portion and the peripheral circuit thereof in the circuit shown in FIG. 1. Switching elements SWe0_0, SWo0_0 to SWei_7, SWoi_7 are respectively provided in bit lines BLe0_0, BLo0_0 to BLei_7, BLoi_7 in the memory cell array 11. The switching elements SWe0_0, SWo0_0 to SWei_7, SWoi_7 are ON/OFF-controlled by a control signal supplied from the control circuit 13. Therefore, the bit lines BLe0_0, BLo0_0 to BLei_7, BLoi_7 are selectively divided into two portions, that is, the memory cell array 11 is selectively divided into blocks 11-1 and 11-2 by the switching elements SWe0_0, SWo0_0 to SWei_7, SWoi_7. One-side ends of the adjacent bit lines BLe0_0, BLo0_0 of the even-numbered and odd-numbered addresses are connected to a data cache DC0_0 and one-side ends of the adjacent bit lines BLe0_7, BLo0_7 of the even-numbered and odd-numbered addresses are connected to a data cache DC0_7. Further, one-side ends of the adjacent bit lines BLei_0, BLoi_0 of the even-numbered and odd-numbered addresses are connected to a data cache DCi_0 and one-side ends of the adjacent bit lines BLei_7, BLoi_7 of the even-numbered and odd-numbered addresses are connected to a data cache DCi_7.

One-side ends of the current paths of MOS transistors Q0_0, ..., Q0_7, ..., Qi_0, ..., Qi_7 are respectively connected to the data caches DC0_0, ..., DC0_7, ..., DCi_0, ..., DCi_7. The other ends of the current paths of the MOS transistors Q0_0, ..., Qi_0 are connected to the input terminal of an output buffer 19-0 which configures one bit of the data output buffer 19. Further, the other ends of the current paths of the MOS transistors Q0_7, ..., Qi_7 are connected to the input terminal of an output buffer 19-7 which configures one bit of the data output buffer 19. The MOS transistors Q0_0, ..., Q0_7 are controlled by a common column selection line CSL0 and the MOS transistors Qi_0, ..., Qi_7 are controlled by a common column selection line CSLi.

Figure 3:
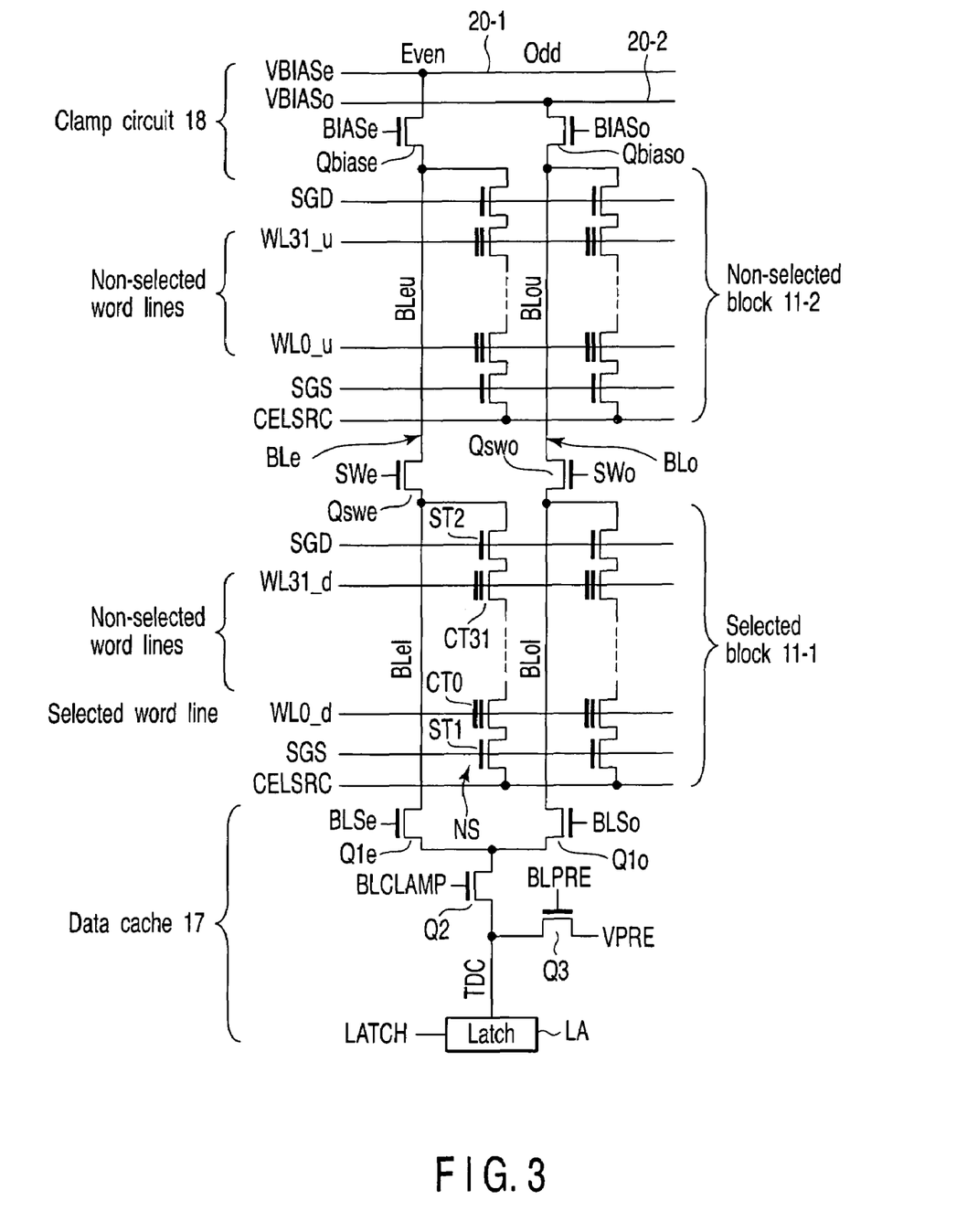
FIG. 3 is a circuit diagram showing an example of the detail configuration of a memory cell array, data cache and clamp circuit with attention paid to two adjacent bit lines of odd-numbered and even-numbered addresses in the circuit of FIG. 2, for illustrating a state in which a word line in the block close to the data cache is selected.

FIG. 3 shows an example of the configuration of the memory cell array 11, data cache 17 and clamp circuit 18 with attention paid to two adjacent bit lines BLo, BLe of odd-numbered and even-numbered addresses in the circuit of FIG. 2. In FIG. 3, a state in which a word line WL0_d in the block 11-1 which is close to the data cache 17 is selected is shown.

In the bit lines BLe, BLo, MOS transistors Qswe, Qswo acting as switching elements (SWe0_0, SWo0_0, to SWei_7, SWoi_7) which divide the bit lines into the bit lines BLel, BLol arranged near the data cache 17 and the bit lines BLeu, BLou arranged far apart from the data cache are provided. The gates of the MOS transistors Qswe, Qswo are supplied with control signals SWe, SWo (corresponding to the control signal CS) from the control circuit 13 and the MOS transistors are ON/OFF-controlled.

The bit lines BLel, BLol, BLeu, BLou are respectively connected to NAND strings. As is represented by the NAND string NS connected to the bit line BLel, an example in which the current paths of 32 cell transistors CT0 to CT31 are serially connected in each NAND string is shown. The current path of a selection gate transistor ST1 is connected between the source of the cell transistor CT0 and a source line CELSRC and the current path of a selection gate transistor ST2 is connected between the source of the cell transistor CT31 and the bit line BLel. The gates of the selection gate transistors ST1 in the NAND strings NS are commonly connected to the selection gate line SGS and the control gates of the cell transistors CT0 to CT31 are commonly connected to the respective word lines WL0_d to WL31_d and WL0_u to WL31_u, and the gates of the selection gate transistors ST2 are commonly connected to the selection gate line SGD.

The current path of a MOS transistor Qbiase is connected between the bit line BLeu and a wiring 20-1 to which bias voltage BIASe is applied and the current path of a MOS transistor Qbiaso is connected between the bit line BLou and a wiring 20-2 to which bias voltage BIASo is applied. The MOS transistors Qbiase, Qbiaso are used for charging (precharging) and discharging (shielding) the bit line and ON/OFF-controlled by bias signals BIASe, BIASo supplied to the gates thereof from the control circuit 13. The bias voltages VBIASe, VBIASo are selectively set to the power supply voltage Vdd or ground potential Vss (0.0 V) at the time of precharging and shielding the bit line, respectively.

Further, one-side ends of the bit lines BLel, BLol are connected to the data cache 17. The data cache 17 includes a sense amplifier portion which senses and amplifies the potentials of the bit lines BLe, BLo and a storage portion which stores the potential amplified by the sense amplifier portion. The data cache is configured by MOS transistors Q1e, Q1o, Q2, Q3 and latch circuit LA. One-side ends of the current paths of the MOS transistors Q1e, Q1o are respectively connected to the bit lines BLel, BLol and the other ends of the current paths thereof are commonly connected. One end of the current path of the MOS transistor Q2 is connected to the common connection node of the current paths of the MOS transistors Q1e, Q1o. The gate of the MOS transistor Q2 is supplied with a bit line clamp signal BLCLAMP. The other end of the current path of the MOS transistor Q2 is connected to a signal line TDC and one end of the current path of the MOS transistor Q3. The signal line TDC is connected to the latch circuit LA. The operation of the latch circuit LA is controlled by a latch signal LATCH supplied from the control circuit 13. The other end of the current path of the MOS transistor Q3 is supplied with precharge voltage VPRE and the gate thereof is supplied with a bit line precharge signal BLPRE from the control circuit 13.

Figure 4:
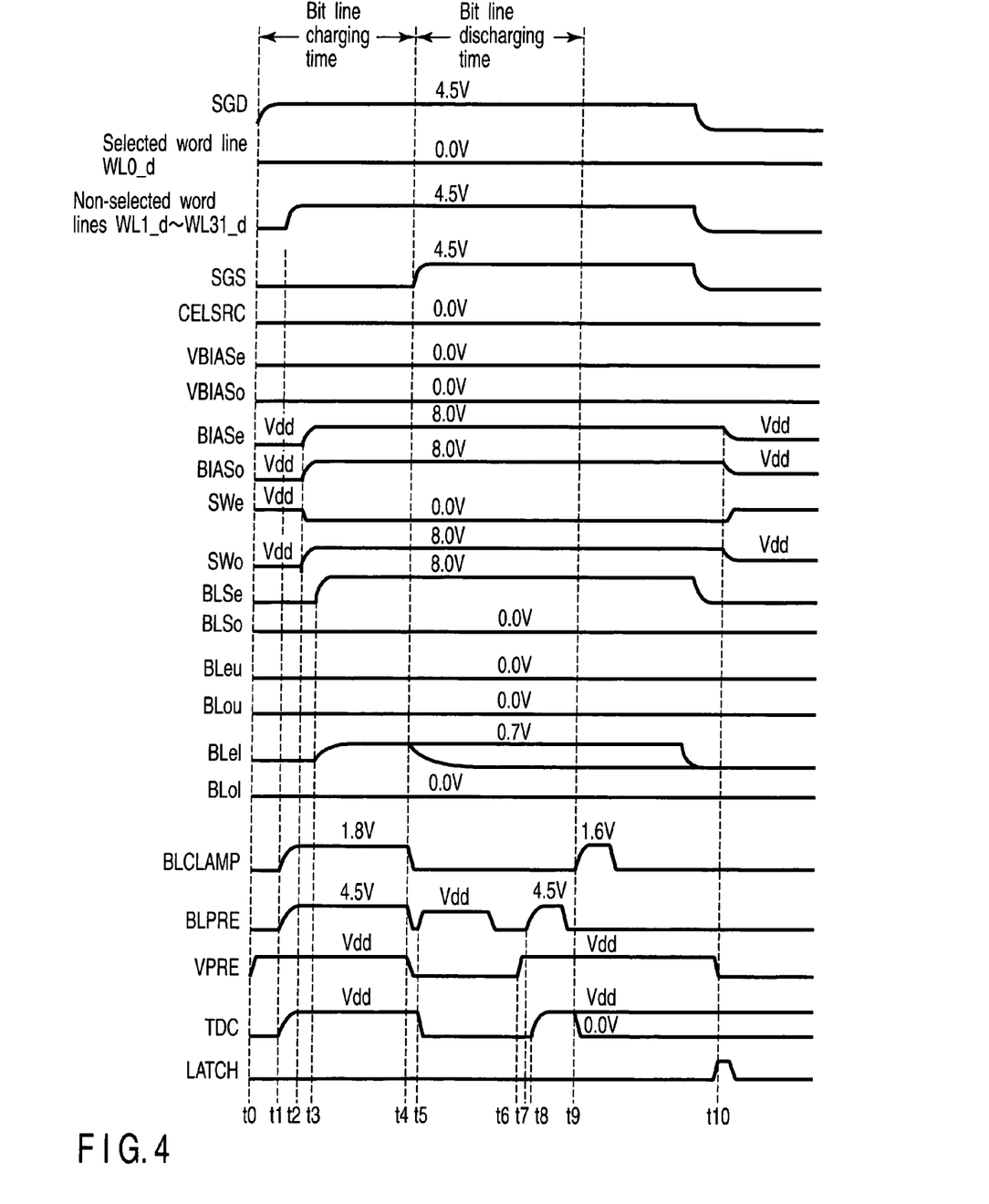
FIG. 4 is a timing chart for illustrating the read/verify operation in the circuit of FIG. 3.

With the above configuration, as shown in the timing chart of FIG. 4, first, the selection gate line SGD is set to approximately 4.5 V to turn ON the selection gate transistor ST2 (time t0). Then, a selected word line of a selected block (in this example, the word line WL0_d in the block 11-1) is set to a detection level (0.0 V=Vcgrx) and non-selected word lines in the selected block 11-1 (the word lines WL1_d to WL31_d) are set to such a level (for example, 4.5 V=Vread) as to sufficiently turn ON the cell transistors (time t1).

At next time t2, the bias signals BIASo, BIASe of the odd-numbered and even-numbered addresses are raised from the power supply voltage Vdd (2.5 V) level to 8.0 V to turn ON the MOS transistors Qbiase, Qbiaso and the bit lines BLeu, BLou are discharged to the ground potential Vss (0.0 V) and shielded.

At the time t0, the precharge voltage VPRE is raised to the power supply voltage Vdd, and at the time t1, the bit line precharge signal BLPRE is set to approximately 4.5 V to turn ON the MOS transistor Q3 and charge the signal line TDC to the Vdd level. At the time t1, the bit line clamp signal BLCLAMP is set to 1.8 V to clamp the source of the MOS transistor Q2 at approximately 0.7 V (if the threshold voltage of the MOS transistor Q2 is 1.1 V, the source is clamped at "1.8 V−1.1 V=0.7 V").

After this (time t3), the bit line selection signal BLSe is set to 8.0 V to turn ON the MOS transistor Q1e and precharge and set the bit line BLel to 0.7 V. At this time, since the MOS transistor Qswe is set in the OFF state, the load capacitance of the bit line BLel to be charged is substantially reduced by half and the charging time is set to approximately half the time required for charging the bit line BLe.

At the time of precharging the bit line BLel, the bit line selection signal BLSo is set at 0.0 V and the MOS transistor Q1o is set in the OFF state. Further, since the MOS transistors Qswo, Qbiase, Qbiaso are set in the ON state and the bias voltages VBIASe, VBIASo are both set at 0.0 V, the bit lines BLeu, BLou, BLol are set at 0.0 V.

At next time t4, the bit line clamp signal BLCLAMP is set to 0.0 V to turn OFF the MOS transistor Q2 and the bit line precharge signal BLPRE is set to 0.0 V and the precharge voltage VPRE is set to the Vss level to discharge the signal line TDC to 0.0 V via the MOS transistor Q3. After this (time t5), the bit line precharge signal BLPRE is set to the Vdd level.

At the time t4, the selection gate line SGS is set to a voltage of approximately 4.5 V to turn ON the selection gate transistor ST2 at the same time as the MOS transistor Q2 is turned OFF. At this time, if the threshold voltage of the cell transistor CT0 is lower than the level (0.0 V) of the selected word line WL0_d of the selected block 11-1 (in the case of "1" cell), the bit line BLel is discharged via the cell transistor CT0. On the other hand, if the threshold voltage of the cell transistor CT0 is higher than the level of the selected word line WL0_d of the selected block 11-1 (in the case of "0" cell), the bit line BLel is not discharged since the cell transistor CT0 is set in the OFF state.

After this, the precharge voltage VPRE is raised to the power supply voltage Vdd (time t6) and the bit line precharge signal BLPRE is raised to a voltage of approximately 4.5 V to turn ON the MOS transistor Q3 (time t7) and charge the signal line TDC to the Vdd level via the MOS transistor Q3 (time t8).

Then, the bit line clamp signal BLCLAMP is set to 1.6 V at time t9 and if the level of the bit line BLel is equal to or higher than 0.5 V (1.6 V−1.1 V: the threshold voltage of the MOS transistor Q2=0.5 V), the MOS transistor Q3 is kept in the OFF state so that charges of the signal line TDC will not be extracted. On the other hand, if the level of the bit line BLel is lower than 0.5 V, the MOS transistor Q3 is turned ON. In this case, since the bit line BLel is discharged, charges are not stored in the capacitor of the bit line BLel and charges on the signal line TDC flow into the bit line. At this time, since the capacitance of the signal line TDC is sufficiently smaller than that of the bit line BLel, most of the charges on the signal line TDC flow into the bit line BLel. Therefore, the signal line TDC is discharged to substantially 0.0 V.

After this (time t10), the potential of the signal line TDC is fetched by the latch circuit LA by performing the control operation using the latch signal LATCH to complete the read/verify operation. At the time t10, the bias signals BIASe, BIASo and control signals SWe, SWo are set at the Vdd level.

As described above, the amount of charges of the bit line which move at the read/verify time can be reduced by half by dividing the bit lines BLe, BLo by use of the MOS transistors Qswe, Qswo. As a result, the charging/discharging time of the bit line can be reduced to half and time required for performing the read/verify operation can be shortened.

In FIGS. 3 and 4, a case wherein the read/verify operation is performed for the bit line BLel of the even-numbered address is explained as an example, but the same explanation is applied to a case wherein the read/verify operation is performed for the bit line BLol of the odd-numbered address.

Figure 5:
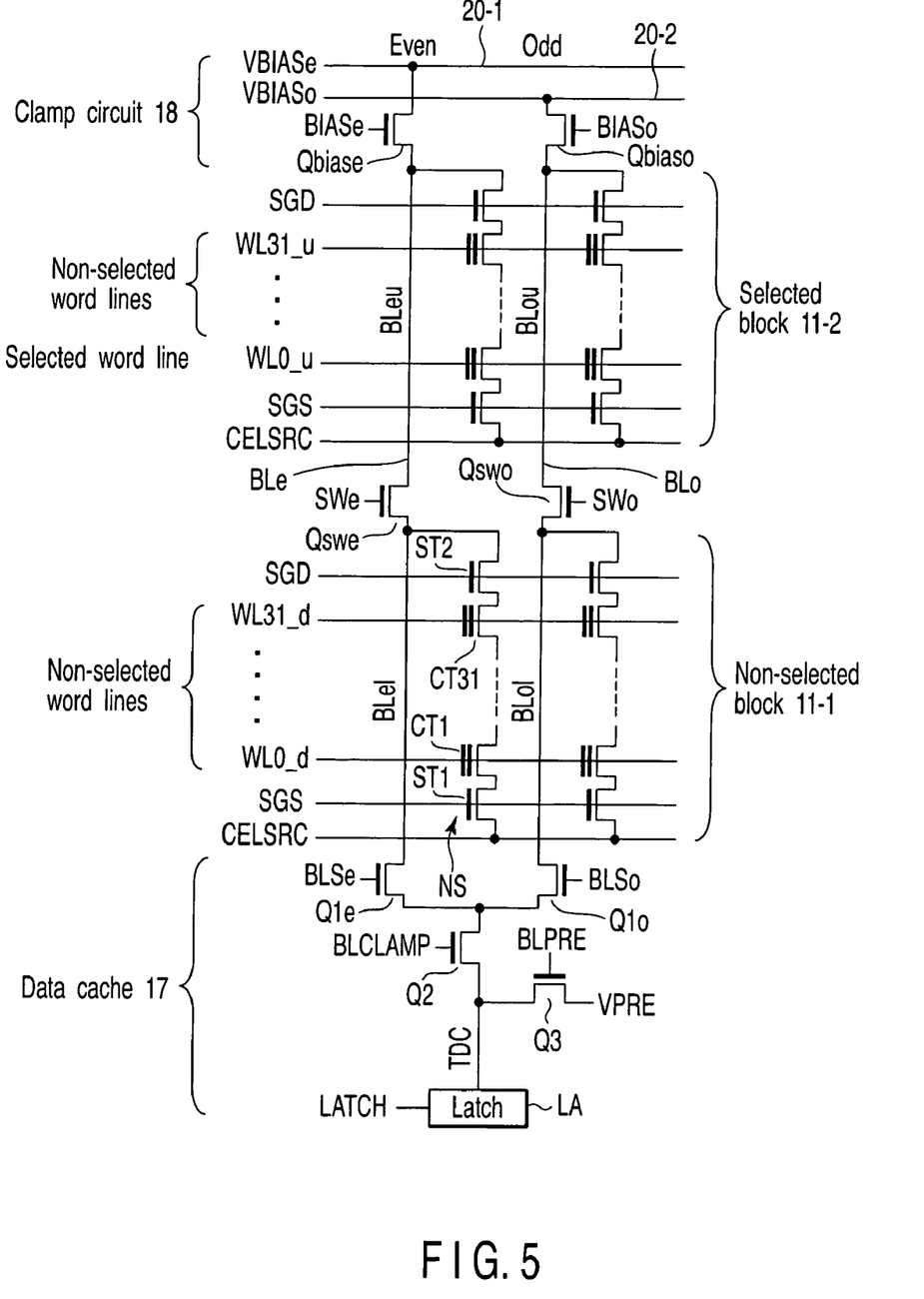
FIG. 5 is a circuit diagram showing an example of the detail configuration of a memory cell array, data cache and clamp circuit with attention paid to two adjacent bit lines of odd-numbered and even-numbered addresses in the circuit of FIG. 2, for illustrating a state in which a word line in the block which is far apart from the data cache is selected.

FIG. 5 shows an example of the detail configuration of the memory cell array 11, data cache 17 and clamp circuit 18 with attention paid to two adjacent bit lines BLo, BLe of odd-numbered and even-numbered addresses in the circuit of FIG. 2. In FIG. 5, a state in which a word line WL0_u in the block 11-2 which is far apart from the data cache 17 is selected is shown.

Figure 6:
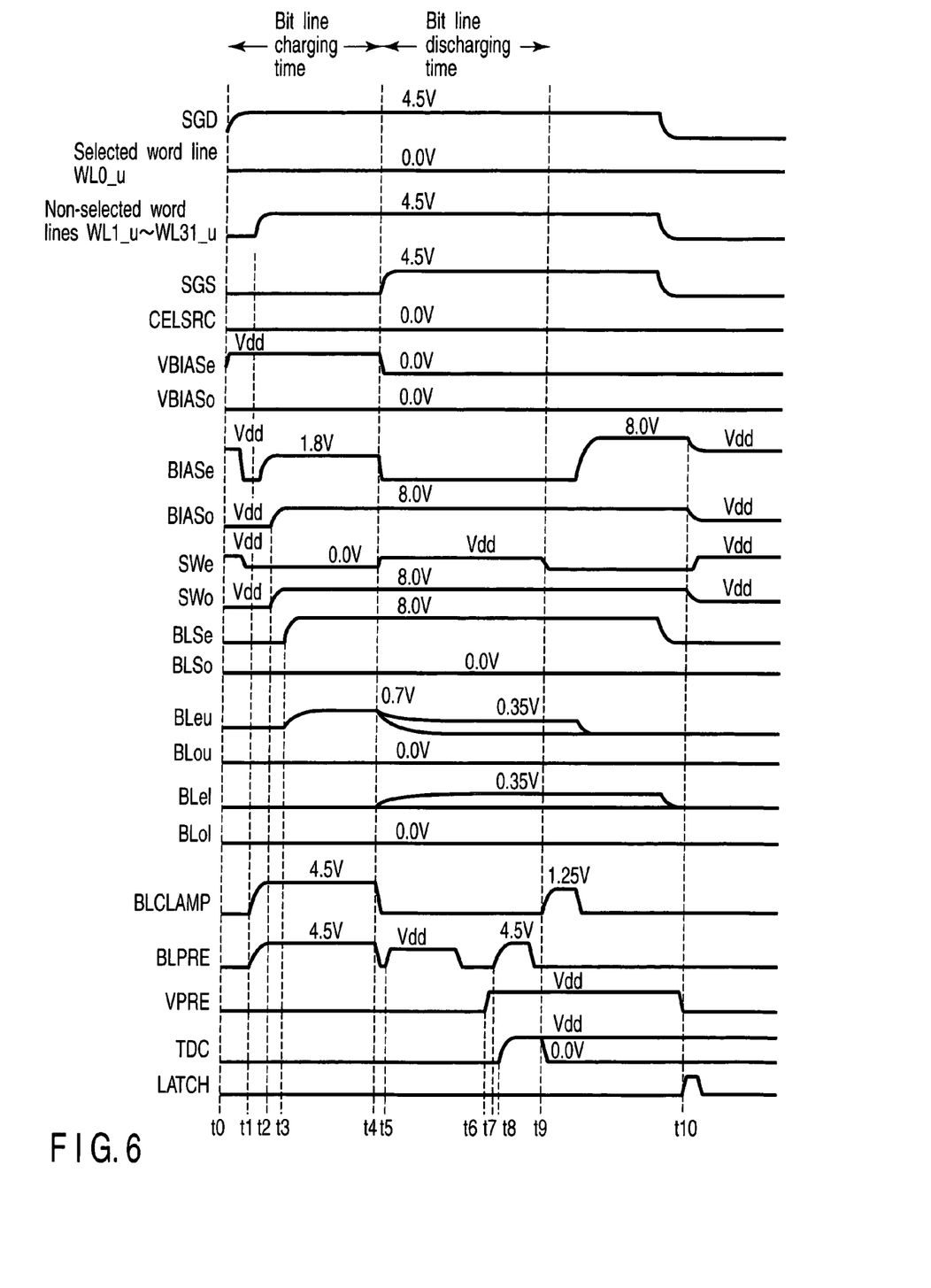
FIG. 6 is a timing chart for illustrating the read/verify operation in the circuit of FIG. 3.

As shown in the timing chart of FIG. 6, first, the selection gate line SGD is set to approximately 4.5 V to turn ON the selection gate transistor ST2 (time t0). Then, a selected word line of a selected block (in this example, the word line WL0_u in the block 11-2) is set to a detection level (0.0 V=Vcgrx) and non-selected word lines in the selected block 11-2 (the word lines WL1_u to WL31_u) are set to a level (for example, 4.5 V=Vread) with which the cell transistors can be sufficiently turned ON (time t1).

At the time t0, the bias voltage VBIASe is set to the power supply voltage Vdd and the bias voltage VBIASo is set to 0.0 V. At this time, the bias signals BIASo, BIASe of the odd-numbered and even-numbered addresses are both set at the Vdd level. After this, the bias signal BIASe of the even-numbered address is set to 0.0 V to turn OFF the MOS transistor Qbiase and the signal SWe is set from the Vdd level to the 0.0 V to turn OFF the MOS transistor Qswe. At this time, the signal SWo is set at the Vdd level. By setting the bias signal BIASo to 8.0 V after setting the bias signal BIASe to 1.8 V, the bit line BLeu is charged (clamped) to 0.7 V and the bit lines BLou, BLol are discharged to 0.0 V and shielded. Since the bit line load capacitance which is substantially half the capacitance of the bit line BLe is charged, the charging time can be reduced to half when the bit line BLeu is charged.

At the time t1, the bit line clamp signal BLCLAMP and bit line precharge signal BLPRE are set at substantially 4.5 V. At this time, the precharge voltage VPRE is set at the ground potential Vss.

Then, at time t3, if the bit line selection signal BLSe is set to 8.0 V to turn ON the MOS transistor Q1e, the bit line BLel is discharged to precharge voltage VPRE (Vss level) via the MOS transistors Q1e, Q2, signal line TDC and MOS transistor Q3. At this time, since the MOS transistor Qswe is set in the OFF state, the load capacitance of the bit line BLel to be discharged is set to substantially half the load capacitance of the bit line BLe and the discharging time is reduced to approximately half the discharging time in the case of discharging the bit line BLe.

At next time t4, the selection gate line SGS is set to a voltage of approximately 4.5 V to turn ON the selection gate transistor ST1. At this time, if the threshold voltage of the cell transistor CT0 is lower than the level (0.0 V) of the selected word line WL0_u of the selected block 11-2 (in the case of "1" cell), the bit line BLeu is discharged via the cell transistor CT0. When the bit line BLeu starts to be discharged, the control signal SWe is set to the Vdd level to turn ON the MOS transistor Qswe and the bit line clamp signal BLCLAMP is set to the Vss level to turn OFF the MOS transistor Q2. At this time, the bit line BLel lying on the data cache 17 side is discharged to the Vss level. In the case of "1" cell, charges are extracted while the bit line BLeu which lies far apart from the data cache 17 (on the clamp circuit 18 side) is being discharged to the Vss level. If the capacitance of each of the bit lines BLe, BLo is set to C, the charge amount of the bit lines BLeu, BLou on the clamp circuit 18 side is set to C/2×0.7 V which is half the charge amount C×0.7 V of the bit lines BLe, BLo. That is, the discharging time of the bit lines BLeu, BLou can be reduced by approximately half.

On the other hand, in the case of "0" cell, the bit line BLeu on the clamp circuit 18 side is charged to 0.7 V and charges start to move via the MOS transistor Qswe after the MOS transistor Qswe is turned ON. Since the charge amount of the bit line BLeu is set to C/2×0.7 V and the charge amount of the bit line BLel is 0, the levels of the bit lines BLeu, BLol are both set to 0.35 V after the MOS transistor Qswe is turned ON.

After this (time t5), the bit line precharge signal BLPRE is set to the Vdd level. Further, the precharge voltage VPRE is raised to the power supply voltage Vdd (time t6) and the bit line precharge signal BLPRE is raised to a voltage of approximately 4.5 V to turn ON the MOS transistor Q3 (time t7). Then, the signal line TDC is charged to the Vdd level via the MOS transistor Q3 (time t8).

After this, the bit line clamp signal BLCLAMP is set to 1.25 V at time t9. The reason why the bit line clamp signal BLCLAMP is lowered from 1.6 V by 0.35 V is that the level of the bit line BLel is lowered from 0.7 V to 0.35 V.

Next (time t10), the potential of the signal line TDC is fetched by the latch circuit LA by performing the control operation using the latch signal LATCH to complete the read/verify operation. At the time t10, the bias signals BIASe, BIASo and control signals SWe, SWo are set at the Vdd level.

In FIGS. 5 and 6, a case wherein the read/verify operation is performed for the bit line BLeu of the even-numbered address is explained as an example, but the same explanation is applied to a case wherein the read/verify operation is performed for the bit line BLou of the odd-numbered address.

As described above, in the present embodiment, the bit lines BLe, BLu are divided into two portions by using the MOS transistors Qswe, Qswo as switching elements and the charge amount which is half the original charge amount is charged or discharged. For example, if the bit line BLe of the odd-numbered address is charged or discharged, the charge amount to be charged or discharged is C×0.7 V in the conventional case when the capacitance of the bit line BLe is set to C. On the other hand, in the present embodiment, since the MOS transistor Qswe is turned OFF when the word line which is arranged closer to the data cache 17 than the MOS transistors Qswe, Qswo is selected, the charge amount of the bit line BLeu is set to 0 and the charge amount of the bit line BLel is set to C/2×0.7 V. Further, when the word line which is arranged closer to the clamp circuit 18 than the MOS transistors Qswe, Qswo is selected, the charge amount of the bit line BLeu when the MOS transistor Qswe is turned OFF is set to C/2×0.7 V and the charge amount of the bit line BLel is set to 0. Likewise, when the word line which is arranged closer to the clamp circuit 18 than the MOS transistors Qswe, Qswo is selected, the charge amount of the bit line BLeu when the MOS transistor Qswe is turned ON is set to C/2×0.7/2 V and the charge amount of the bit line BLel is set to C/2×0.7/2 V.

Therefore, the charging/discharging time of the bit line can be substantially reduced by half and time for the read/verify operation can be shortened.

In the present embodiment, a case wherein the bit lines are divided into two portions, the charge amount of the bit line is reduced by half and the charging/discharging time of the bit line is reduced by half is explained as an example. However, if the bit lines are divided into n portions (n is a positive integer equal to or larger than 3), the charge amount of the bit line can be set to 1/n times and the charging/discharging time of the bit line can be reduced to 1/n times.

As described above, according to one aspect of this invention, a nonvolatile semiconductor memory device in which the write and verify operation speeds can be enhanced can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array having memory cells arranged in a matrix form,
   a clamp circuit connected between one-side ends of first and second bit lines which are adjacent in the memory cell array and first and second wirings to which first and second bias voltages are applied and configured to set potentials of the first and second bit lines,
   a data cache connected to the other ends of the first and second bit lines in the memory cell array,
   first and second switching elements which selectively divide the first and second bit lines into plural portions, and
   a control circuit configured to control the data cache, clamp circuit and first and second switching elements, the control circuit charges part of one of the first and second bit lines to which a memory cell of an address to be written is connected and which is divided by a corresponding one of the first and second switching elements by use of one of the clamp circuit and data cache and discharges and shields the other bit lines by use of the clamp circuit.

2. The nonvolatile semiconductor memory device according to claim 1, wherein the memory cell array has a plurality of blocks corresponding to the first and second bit lines divided by the first and second switching elements.

3. The nonvolatile semiconductor memory device according to claim 2, wherein the memory cell is a cell transistor in NAND strings connected to the first and second bit lines.

4. The nonvolatile semiconductor memory device according to claim 3, wherein the NAND strings includes a plurality of cell transistors whose current paths are serially connected, a first selection gate transistor whose current path is connected between a source of the cell transistor and a source line and a second selection gate transistor whose current path is connected between a drain of the cell transistor and the bit line.

5. The nonvolatile semiconductor memory device according to claim 4, further comprising word lines respectively connected to control gates of the plurality of cell transistors, a first selection gate line connected to a gate of the first selection gate transistor and a second selection gate line connected to a gate of the second selection gate transistor.

6. The nonvolatile semiconductor memory device according to claim 1, wherein the clamp circuit has first and second MOS transistors whose current paths are connected between one-side ends of the first and second bit lines and the first and second wirings and which are supplied at gates thereof with first and second control signals from the control circuit and are ON/OFF-controlled.

7. The nonvolatile semiconductor memory device according to claim 6, wherein the first and second MOS transistors selectively charges and discharges the first and second bit lines based on the control operation using the first and second control signals.

8. The nonvolatile semiconductor memory device according to claim 1, wherein the data cache includes a sense amplifier portion which senses and amplifies potentials of the first and second bit lines and a storage portion which stores the potential amplified by the sense amplifier portion.

9. The nonvolatile semiconductor memory device according to claim 8, wherein the sense amplifier portion includes third and fourth MOS transistors whose current paths are connected at one-side ends to the other ends of the first and second bit lines and commonly connected at the other ends and whose gates are supplied with first and second bit line selection signals from the control circuit, a fifth MOS transistor whose current path is connected at one end to the other ends of the third and fourth MOS transistors and whose gate is supplied with a bit line clamp signal from the control circuit, and a sixth MOS transistor whose current path is connected at one end to the other end of the current path of the fifth MOS transistor and applied at the other end with precharge voltage and whose gate is supplied with a bit line precharge signal.

10. The nonvolatile semiconductor memory device according to claim 9, wherein the storage portion includes a latch circuit which is connected to the other end of the current path of the fifth MOS transistor and whose operation is controlled according to a latch signal supplied from the control circuit.

11. The nonvolatile semiconductor memory device according to claim 1, wherein the first and second switching elements are ON/OFF-controlled in response to a control signal supplied from the control circuit and the first and second bit lines are divided into plural portions when the first and second switching elements are set in the OFF state.

12. The nonvolatile semiconductor memory device according to claim 11, wherein the first and second switching elements include seventh and eighth MOS transistors whose current paths are connected to the first and second bit lines and whose gates are supplied with the control signal.

13. The nonvolatile semiconductor memory device according to claim 1, wherein the control circuit turns OFF the first switching element and turns ON the second switching element when a memory cell of an address to be written is connected to the first bit line which is arranged on the data cache side with respect to the first and second switching elements,
turns OFF the second switching element and turns ON the first switching element when a memory cell of an address to be written is connected to the second bit line which is arranged on the data cache side with respect to the first and second switching elements,
turns OFF the first switching element and turns ON the second switching element when a memory cell of an address to be written is connected to the first bit line which is arranged on the clamp circuit side with respect to the first and second switching elements, and
turns OFF the second switching element and turns ON the first switching element when a memory cell of an address to be written is connected to the second bit line which is arranged on the clamp circuit side with respect to the first and second switching elements.

14. The nonvolatile semiconductor memory device according to claim 13, wherein the data cache charges part of the first bit line which is divided on the data cache side and the clamp circuit discharges and shields part of the first bit line which is divided on the clamp circuit side and the second bit line when the memory cell of the address to be written is connected to the first bit line which is arranged on the data cache side with respect to the first and second switching elements.

15. The nonvolatile semiconductor memory device according to claim 13, wherein the data cache charges part of the second bit line which is divided on the data cache side and the clamp circuit shields part of the second bit line which is divided on the clamp circuit side and the first bit line when the memory cell of the address to be written is connected to the second bit line which is arranged on the data cache side with respect to the first and second switching elements.

16. The nonvolatile semiconductor memory device according to claim 13, wherein the clamp circuit charges and clamps part of the first bit line which is divided on the clamp circuit side and discharges and shields the second bit line and the data cache discharges part of the first bit line which is divided on the data cache side when the memory cell of the address to be written is connected to the first bit line which is arranged on the clamp circuit side with respect to the first and second switching elements.

17. The nonvolatile semiconductor memory device according to claim 13, wherein the clamp circuit charges and clamps the second bit line which lies on the clamp circuit side and discharges and shields the first bit line and the data cache discharges part of the second bit line which is divided on the data cache side when the memory cell of the address to be written is connected to the second bit line which is arranged on the clamp circuit side with respect to the first and second switching elements.

18. The nonvolatile semiconductor memory device according to claim 1, further comprising a command input buffer to which a command is input, an address input buffer to which an address signal is input, a row decoder which decodes a row address signal supplied from the address input buffer, and a column decoder which decodes a column address signal supplied from the address input buffer.

19. The nonvolatile semiconductor memory device according to claim 18, wherein the control circuit decodes a command input to the command input buffer to control the address input buffer, row decoder, data cache and clamp circuit according to the command.

20. The nonvolatile semiconductor memory device according to claim 1, further comprising a data output buffer which outputs an output signal of the data cache to an exterior.

* * * * *